(12) United States Patent
Lee et al.

(10) Patent No.: US 12,298,814 B2
(45) Date of Patent: May 13, 2025

(54) BRACKET, BRACKET MANUFACTURING METHOD AND ELECTRONIC DEVICE, INCLUDING THE SAME

(71) Applicant: SAMSUNG ELECTRONICS CO., LTD., Suwon-si (KR)

(72) Inventors: Heesung Lee, Suwon-si (KR); Goeun Kim, Suwon-si (KR); Inkyu Kim, Suwon-si (KR); Hyunsoo Kim, Suwon-si (KR); Hyesun Park, Suwon-si (KR); Youngjun Heo, Suwon-si (KR); Youngsoo Jung, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 272 days.

(21) Appl. No.: 17/957,896

(22) Filed: Sep. 30, 2022

(65) Prior Publication Data

US 2023/0102327 A1    Mar. 30, 2023

Related U.S. Application Data

(63) Continuation of application No. PCT/KR2022/014637, filed on Sep. 29, 2022.

(30) Foreign Application Priority Data

Sep. 30, 2021  (KR) .................. 10-2021-0130066

(51) Int. Cl.
*H05K 5/02* (2006.01)
*G06F 1/16* (2006.01)
*H05K 5/04* (2006.01)

(52) U.S. Cl.
CPC .......... *G06F 1/1656* (2013.01); *H05K 5/0243* (2013.01); *H05K 5/04* (2013.01);
(Continued)

(58) Field of Classification Search
CPC .. H05K 5/04; H05K 5/0243; Y10T 29/49888; Y10T 29/49986; Y10T 29/49995
See application file for complete search history.

(56) References Cited

U.S. PATENT DOCUMENTS

| 10,412,846 | B1 | 9/2019 | Phan Thanh et al. |
| 2013/0075262 | A1 | 3/2013 | Teng |

(Continued)

FOREIGN PATENT DOCUMENTS

| KR | 20130113155 A | 10/2013 |
| KR | 20140084370 A | 7/2014 |

(Continued)

OTHER PUBLICATIONS

International Search Report and Written Opinion for International Application No. PCT/KR2022/014637; International Filing Date Sep. 29, 2022; Date of Mailing Dec. 14, 2022; 9 Pages.

*Primary Examiner* — Jermie E Cozart
(74) *Attorney, Agent, or Firm* — CANTOR COLBURN LLP

(57) ABSTRACT

An electronic device according to various embodiments of the disclosure may include: a cover glass configured to protect a display; and a bracket, wherein the bracket includes: a first area in contact with the cover glass; and a second area extending from the first area, the first area includes a first surface layer to which a first texture and a first color are applied, the second area includes a second surface layer to which a second texture different from the first texture is applied, the first color is substantially the same color as the cover glass, and the first texture is substantially the same texture as the cover glass.

11 Claims, 11 Drawing Sheets

(52) U.S. Cl.
CPC .... *Y10T 29/49888* (2015.01); *Y10T 29/49986* (2015.01); *Y10T 29/49995* (2015.01)

(56) References Cited

U.S. PATENT DOCUMENTS

| | | |
|---|---|---|
| 2013/0153428 A1 | 6/2013 | Akana et al. |
| 2014/0346049 A1 | 11/2014 | Khosla |
| 2017/0013735 A1 | 1/2017 | Choi et al. |
| 2017/0097661 A1 | 4/2017 | Park |
| 2017/0347476 A1 | 11/2017 | Hwang et al. |
| 2020/0137911 A1 | 4/2020 | Kim et al. |
| 2020/0371659 A1 | 11/2020 | Kim et al. |
| 2021/0151856 A1 | 5/2021 | Kim et al. |
| 2021/0263557 A1 | 8/2021 | Seo et al. |

FOREIGN PATENT DOCUMENTS

| | | |
|---|---|---|
| KR | 20140098172 A | 8/2014 |
| KR | 20160015651 A | 2/2016 |
| KR | 20170006709 A | 1/2017 |
| KR | 20170134001 A | 12/2017 |
| KR | 20180134724 A | 12/2018 |
| KR | 20190098658 A | 8/2019 |
| KR | 20200046628 A | 5/2020 |
| KR | 20210061859 A | 5/2021 |
| WO | 2021112547 A1 | 6/2021 |

BRACKET, BRACKET MANUFACTURING METHOD AND ELECTRONIC DEVICE, INCLUDING THE SAME

CROSS-REFERENCE TO RELATED APPLICATIONS

This application is based on and claims priority under 35 U.S.C. § 120 to PCT International Application No. PCT/KR2022/014637, which was filed on Sep. 29, 2022, and claims priority to Korean Patent Application No. 10-2021-0130066, filed on Sep. 30, 2021, in the Korean Intellectual Property Office, the disclosure of which are incorporated by reference herein their entirety.

BACKGROUND

Field

Various embodiments of the disclosure relate to a bracket, a bracket manufacturing method, and an electronic device including the same.

Description of Related Art

Electronic devices may output stored information as sounds or images. In line with the high degree of integration of electronic devices and the widespread use of super-fast large-capacity wireless communication, it has recently become possible to equip a single electronic device (for example, mobile communication terminal) with various functions. For example, not only a communication function, but also an entertainment function (for example, gaming), a multimedia function (for example, music/video playback), communication and security functions for mobile banking, and/or a scheduling function or an electronic wallet function may be integrated into a single electronic device.

Recently, electronic devices such as smartphones and/or laptops are required to have small sizes, flat shapes, and/or portability, and there have been efforts to provide electronic devices have aesthetically designed exteriors. In addition, there has been ongoing development to give not only design-related effects, but also functional effects to the exterior of electronic devices.

Mobile phones having stereoscopic exteriors have been manufactured by using 3D cover glass, in view of the exterior design of electronic devices, but 3D cover glass may have too high manufacturing costs.

SUMMARY

According to various embodiments of the disclosure, a first area of a bracket supporting an electronic device may be implemented to have substantially the same texture and color as cover glass, thereby exhibiting an impression of unity with cover glass (for example, 2D cover glass, 2.5D cover glass). The effect of unity between the first area having a curved shape and the cover glass may make the cover glass having a flat shape appear as if 3D cover glass.

An electronic device according to various embodiments of the disclosure may include: a cover glass configured to protect a display; and a bracket configured to support the electronic device, wherein the bracket includes: a first area in contact with the cover glass; and a second area extending from the first area, the first area includes a first surface layer to which a first texture and a first color are applied, the second area includes a second surface layer to which a second texture different from the first texture is applied, the first color is substantially the same color as the cover glass, and the first texture is substantially the same texture as the cover glass.

A method for manufacturing a bracket of an electronic device according to various embodiments of the disclosure may include: polishing a surface of a metal member of the bracket; disposing a masking layer on a first area of the bracket; implementing a texture different from that of the first area in a second area of the bracket; removing the masking layer; and performing anodizing on the polished first area and the second area in which the texture different from that of the first area is implemented.

According to various embodiments, a first area of a bracket may include a first surface layer having substantially the same first texture and first color as a cover glass of the electronic device, and by exhibiting an impression of unity between the first area of the bracket having a curved shape and the cover glass, the cover glass having a 2D shape may be expressed as if having a 3D shape.

According to various embodiments, a second area of the bracket may have a second texture different from the cover glass, and differentiation from the first area of the bracket may maximize the extent to which the cover glass having a 2D shape appears as if having a 3D shape.

According to various embodiments, distinction between the first and second areas of the bracket may make the overall housing area visually appear narrow. This may make the electronic device appear slim.

DETAILED DESCRIPTION

Figure 1:
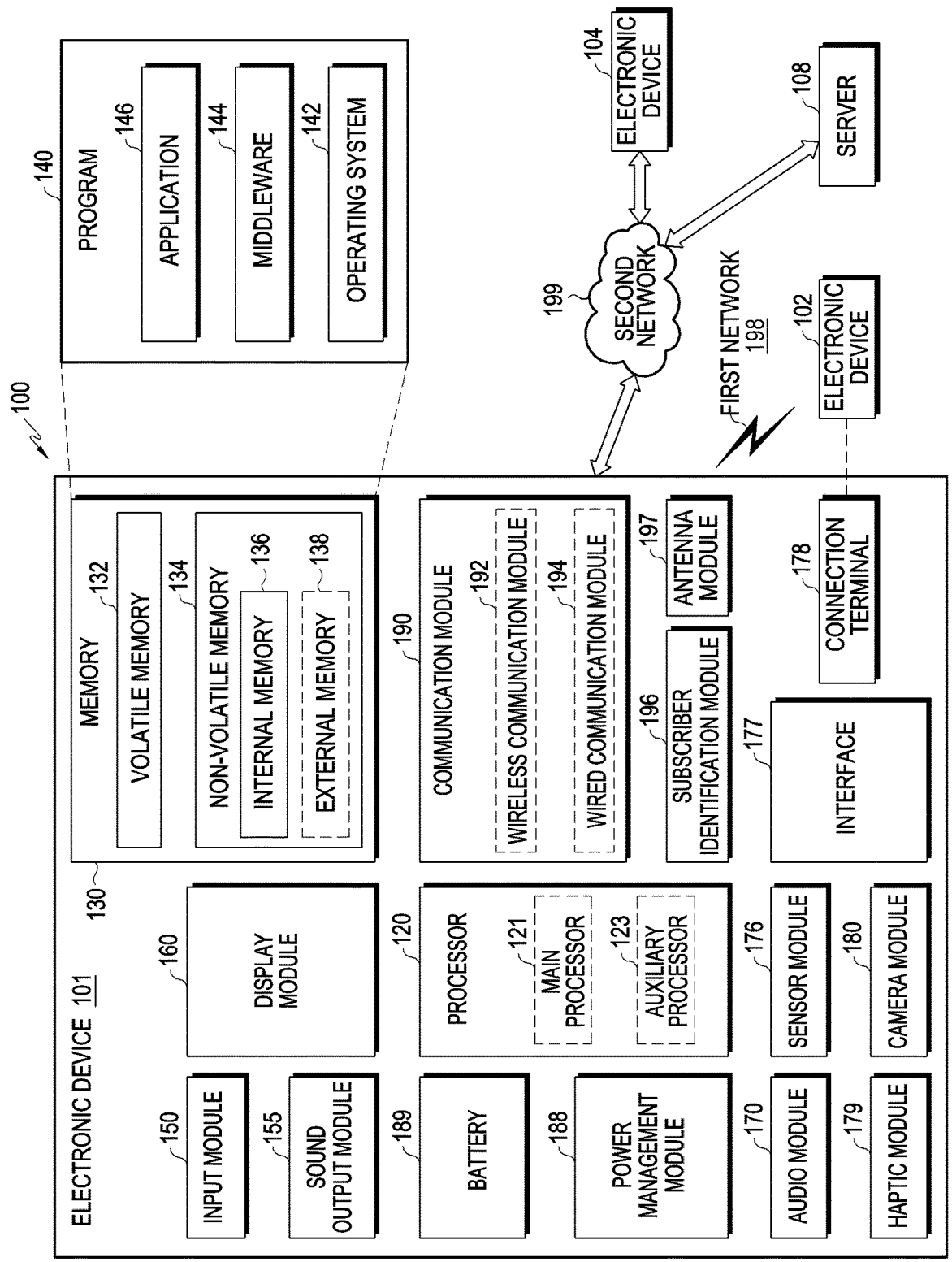
FIG. 1 is a block diagram of an electronic device in a network environment according to various embodiments.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control, for example, at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active (e.g., executing an application) state. According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence model is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or an external electronic device (e.g., an electronic device 102 (e.g., a speaker or a headphone)) directly or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify or authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, an RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the external electronic devices 102 or 104 may be a device of a same type as, or a different type, from the electronic device 101. According to an embodiment, all or some of operations to be executed at the electronic device 101 may be executed at one or more of the external devices. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C", may include any one of, or all possible combinations of the items enumerated together in a corresponding one of the phrases. As used herein, such terms as "1st" and "2nd", or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", "connected with", or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic", "logic block", "part", or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program) including one or more instructions that are stored in a storage medium (e.g., internal memory or external memory) that is readable by a machine (e.g., the electronic device). For example, a processor (e.g., the processor) of the machine (e.g., the electronic device) may invoke at least one of the one or more instructions stored in the storage medium, and execute it. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components or operations may be omitted, or one or more other components or operations may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
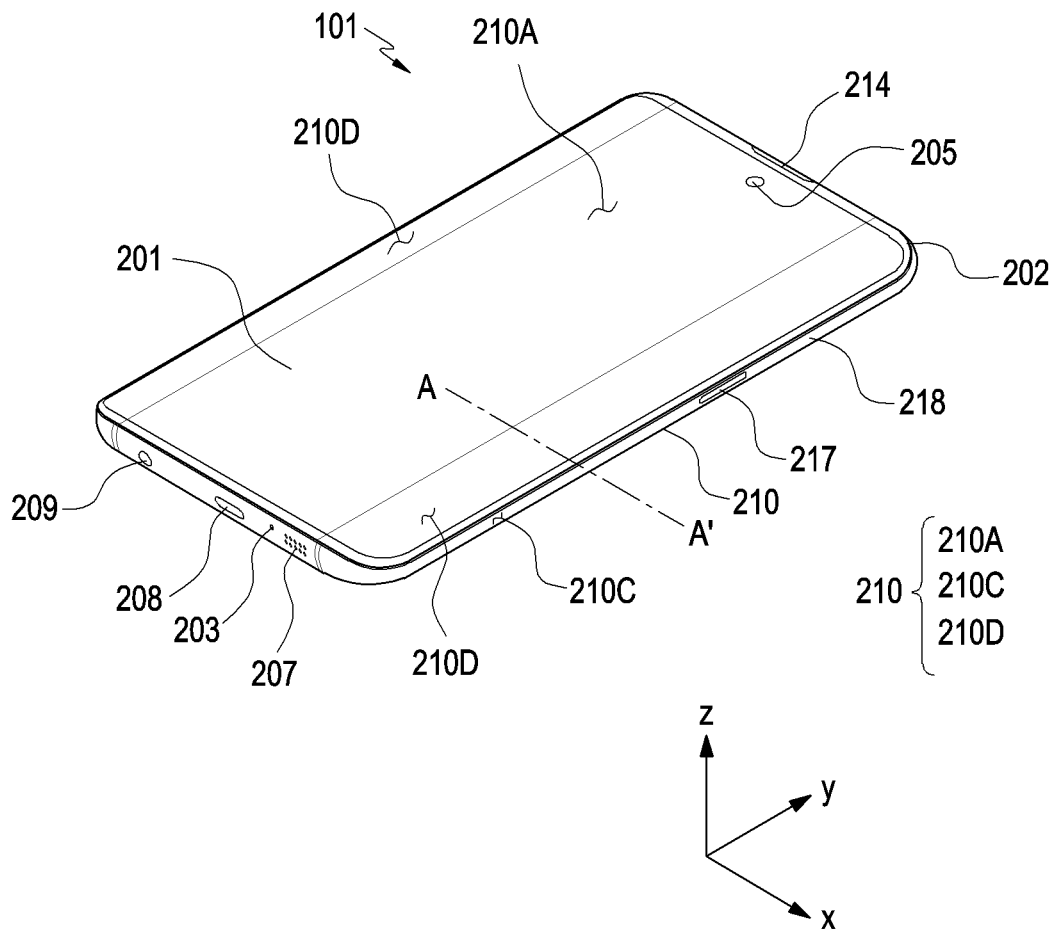
FIG. 2 is a front perspective view of an electronic device according to various embodiments of the disclosure.
Figure 3:
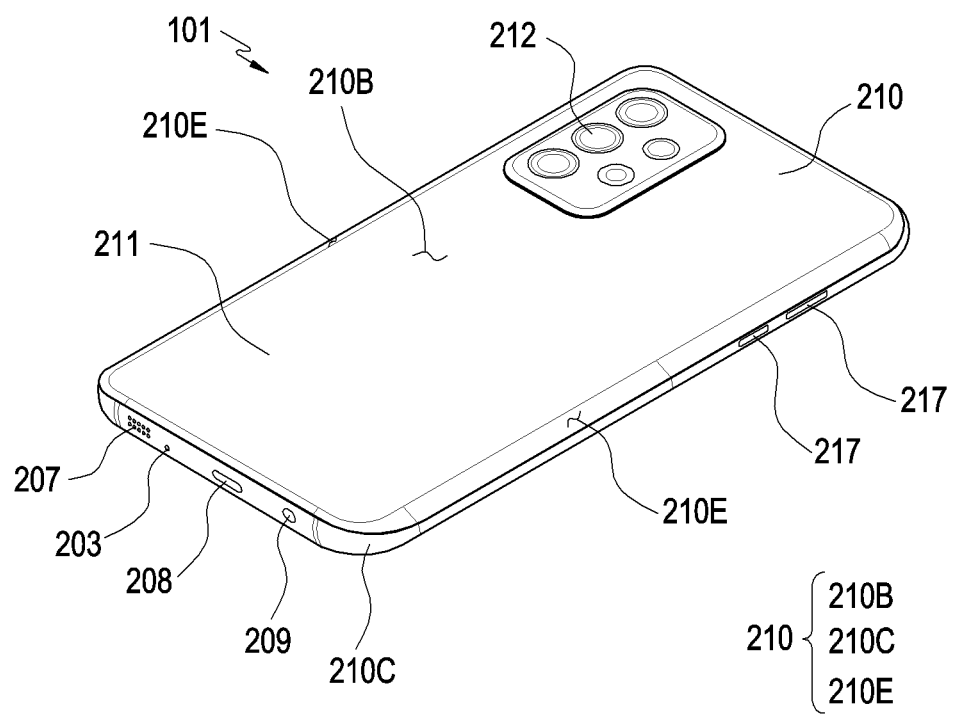
FIG. 3 is a rear perspective view of an electronic device according to various embodiments of the disclosure.

FIG. 2 is a front perspective view of an electronic device 101 according to an embodiment of the disclosure. FIG. 3 is a rear perspective view of the electronic device 101 according to an embodiment of the disclosure.

In FIGS. 2 and 3, "Y" may refer to a longitudinal direction of the electronic device 101. In addition, in an embodiment of the disclosure, "+Y" may refer to an upward direction of the electronic device, and "−Y" may refer to a downward direction of the electronic device. As illustrated in FIG. 2, a coordinate axis is illustrated, indicating the "Y" direction (longitudinal direction), an "X" direction (normal to the Y direction, and in a plane or front surface of the electronic device 101), and a "Z" direction (normal to the XY-plane and indicating a depth direction from the surface of the electronic device 101).

Referring to FIGS. 2 and 3, the electronic device 101 according to an embodiment may include a housing 210 including a front surface 210A, a rear surface 210B, and a side surface 210C surrounding a space between the front surface 210A and the rear surface 210B. In another embodiment (not illustrated), the housing 210 may refer to a structure which configures a part of the front surface 210A of FIG. 2 and the rear surface 210B and the side surface 210C of FIG. 2. According to an embodiment, at least a part of the first surface 210A may be configured by a substantially transparent front plate 202 (e.g., a glass plate, a polymer plate, or a cover glass including various coating layers). The front plate 202 (e.g., a cover glass) may be formed from 2D glass or 2.5D glass or otherwise configured to operate as a 2D or 2.5D display surface. The rear surface 210B may be configured by a rear plate 211. The rear plate 211 may be formed of, for example, glass, ceramic, polymer, or metal (e.g., aluminum, stainless steel (STS), magnesium, etc.), or a combination of at least two of the above materials. The side surface 210C may be configured by a side bezel structure (or a "side member") 218 coupled to the front plate 202 and the rear plate 211. The side surface 210C may be formed from metal and/or polymer material(s). In some embodiments, the rear plate 211 and the side bezel structure 218 may be integrally configured and may be formed from the same material (e.g., glass, a metal material such as aluminum, or a ceramic).

In the illustrated embodiment, the front plate 202 may include, at the long opposite side edges of the front plate 202 (e.g., in the Y-direction), two first edge areas 210D which are bent and seamlessly extend from the front surface 210A toward the rear plate 211. In the illustrated embodiment (see FIG. 3), the rear plate 211 may include, at the long opposite side edges thereof (e.g., in the Y-direction), two second edge areas 210E which are bent and seamlessly extend from the rear surface 210B toward the front plate 202. In some embodiments, the front plate 202 (and/or the rear plate 211) may include only one of the first edge areas 210D (or the second edge areas 210E). In another embodiment, some of the first edge areas 210D and the second edge areas 210E may not be included. In the above embodiments, when viewed from a side of the electronic device 101, the side bezel structure 218 may have a first thickness (or width) on the side where the first edge areas 210D and/or the second edge areas 210E are not included, and may have a second thickness, which is thinner than the first thickness, at the locations where the first edge areas 210D and/or the second edge areas 210E are included.

According to an embodiment, the electronic device 101 may include at least one of a display 201, audio modules 203, 207, 214 (e.g., the audio module 170 of FIG. 1), a sensor module (e.g., the sensor module 176 of FIG. 1), camera modules 205, 212 (e.g., the camera module 180 of FIG. 1), key input devices 217 (e.g., the input module 150 of FIG. 1), and connector holes 208, 209 (e.g., the connection terminal 178 of FIG. 1). In some embodiments, at least one (e.g., the connector hole 209) of the components may be omitted from the electronic device 101, or the electronic device 101 may additionally include other components.

According to an embodiment, the display 201 may be visually exposed through, for example, a substantial part of the front plate 202. In some embodiments, at least a part of the display 201 may be exposed through the front plate 202 and encompassing the front surface 210A and the first edge areas 210D. In some embodiments, the edges of the display 201 may be configured to be substantially the same as the outer contour shape of the front plate 202 adjacent thereto. In another embodiment (not illustrated), the distance between the outer contour of the display 201 and the outer contour of the front plate 202 may be substantially constant in order to enlarge an exposed area of the display 201.

According to an embodiment, the surface (or the front plate 202) of the housing 210 may include a screen display area formed as the display 201 is visually exposed. For example, the screen display area may include the front surface 210A and the first edge areas 210D.

In another embodiment (not illustrated), a recess or an opening is disposed in a part of the screen display area (e.g., the front surface 210A and the first edge areas 210D) of the display 201, and at least one of the audio module 214, a sensor module (not illustrated), a light-emitting element (not illustrated), and a camera module 205 aligned with the recess or the opening may be included. In another embodiment (not illustrated), at least one of the audio module 214, the sensor module (not illustrated), the camera module 205, a fingerprint sensor (not illustrated), and the light-emitting element (not illustrated) may be included on the rear surface of the screen display area of the display 201. In another embodiment (not illustrated), the display 201 may be coupled to or disposed adjacent to a touch-sensing circuit, a pressure sensor capable of measuring the intensity (pressure) of a touch, and/or a digitizer which detects a magnetic field-type stylus pen. In some embodiments, at least a part of the key input devices 217 may be disposed in the first edge areas 210D and/or the second edge areas 210E.

According to an embodiment, the audio modules 203, 207, 214 may include, for example, a microphone hole 203 and speaker holes 207, 214. The microphone hole 203 may include a microphone disposed therein so as to acquire external sound, and in some embodiments, multiple microphones may be disposed therein so as to detect the direction of sound. The speaker holes 207, 214 may include an external speaker hole 207 and a phone call receiver hole 214.

In some embodiments, the speaker holes 207, 214 and the microphone hole 203 may be implemented as a single hole, or a speaker may be included without the speaker holes 207, 214 (e.g., a piezo speaker). The audio modules 203, 207, 214 are not limited to the above structure and/or locations, and various design changes may be made, such as mounting only some audio modules or adding a new audio module, depending on the structure of the electronic device 101.

According to an embodiment, the sensor module (not illustrated) may generate, for example, an electrical signal or data value corresponding to an internal operating state or an external environmental condition of the electronic device 101. The sensor module (not illustrated) may include, for example, a first sensor module (e.g., a proximity sensor) and/or a second sensor module (e.g., a fingerprint sensor) disposed on the front surface 210A of the housing 210, and/or a third sensor module (e.g., an HRM sensor) and/or a fourth sensor module (e.g., a fingerprint sensor) disposed on the rear surface 210B of the housing 210. In some embodiments (not illustrated), a fingerprint sensor may be disposed not only on the front surface 210A (e.g., the display 201) of the housing 210, but also on the rear surface 210B. The electronic device 101 may further include one or more sensor modules, which are not illustrated, such as gesture sensors, gyro sensors, air pressure sensors, magnetic sensors, acceleration sensors, grip sensors, color sensors, infrared (IR) sensors, biometric sensors, temperature sensors, humidity sensors, illuminance sensors, and the like, as will be appreciated by those of skill in the art. The sensor modules are not limited to the above structures and functions, and various design changes may be made, such as mounting only some of the sensor modules or adding a new sensor module, depending on the structure of the electronic device 101.

According to an embodiment, the camera modules 205, 212 may include, for example, a front camera module 205 disposed on the front surface 210A of the electronic device 101, a rear camera module 212 disposed on the rear surface 210B, and/or a flash (not illustrated). The camera modules 205, 212 may include one or more lenses, an image sensor, and/or an image signal processor. The flash may include, for example, a light-emitting diode or a xenon lamp. In some embodiments, two or more lenses (e.g., an infrared camera lens, a wide-angle lens, and a telephoto lens) and image sensors may be arranged on one surface of the electronic device 101. The camera modules 205, 212 are not limited to the above structure, and various design changes may be made, such as mounting only some camera modules or adding a new camera module, depending on the structure of the electronic device 101.

According to an embodiment, the electronic device 101 may include multiple camera modules (e.g., a dual camera or a triple camera) each having a different property (e.g., an angle of view) and/or function. For example, multiple camera modules 205, 212 including lenses having different angles of view may be configured, and the electronic device 101 may control to change the angles of view of the camera modules 205, 212 performed by the electronic device 101, based on a user's selection. For example, at least one of the multiple camera modules 205, 212 may be a wide-angle camera, and at least the other may be a telephoto camera. Similarly, at least one of the multiple camera modules 205, 212 may be a front camera, and at least the other may be a rear camera. In addition, the multiple camera modules 205, 212 may include at least one of a wide-angle camera, a telephoto camera, or an infrared (IR) camera (e.g., a time of flight (TOF) camera or a structured light camera). According to an embodiment, an IR or TOF camera may be operated as at least a part of a sensor module of the electronic device 101. For example, the TOF camera may be operated as at least a part of a sensor module (not illustrated) for detecting a distance to a subject.

According to an embodiment, the key input devices 217 may be disposed on the side surface 210C of the housing 210. In another embodiment, the electronic device 101 may not include some or all of the above-mentioned key input devices 217, and a key input device 217, which is not included, may be implemented in another form, such as a soft key, on the display 201. In some embodiments, the key input devices may include a sensor module 216 disposed on the rear surface 210B of the housing 210.

According to an embodiment, the light-emitting element (not illustrated) may be disposed, for example, on the front surface 210A of the housing 210. The light-emitting element (not illustrated) may provide, for example, state information of the electronic device 101 in the form of light. In another embodiment, the light-emitting element (not illustrated) may provide a light source which is interlocked with, for example, an operation of the front camera module 205. The light-emitting element (not illustrated) may include, for example, an LED, an IR LED, and/or a xenon lamp.

According to an embodiment, the connector holes 208, 209 may include, for example, a first connector hole 208 capable of receiving a connector (e.g., a USB connector) for transmitting or receiving power and/or data to or from an external electronic device, and/or a second connector hole 209 capable of receiving a connector (e.g., an earphone jack) for transmitting or receiving an audio signal to or from an electronic device.

According to an embodiment, the camera module 205 of the camera modules 205, 212 and/or some sensor modules among the sensor modules (not illustrated) may be disposed to be exposed to the outside through at least a part of the display 201. For example, the camera module 205 may include a punch hole camera disposed inside a hole or a recess disposed on the rear surface of the display 201. According to an embodiment, the camera module 212 may be disposed inside the housing 210 such that a lens is exposed to the rear surface 210B of the electronic device 101. For example, the camera module 212 may be disposed on a printed circuit board (e.g., a printed circuit board 240 of FIG. 4).

According to an embodiment, the camera module 205 and/or the sensor module may be disposed so as to be in contact with an external environment through a transparent area from the internal space of the electronic device 101 to the front plate 202 of the display 201. In addition, the sensor module 204 may be disposed to perform its function without being visually exposed through the front plate 202 in the internal space of the electronic device.

Figure 4:
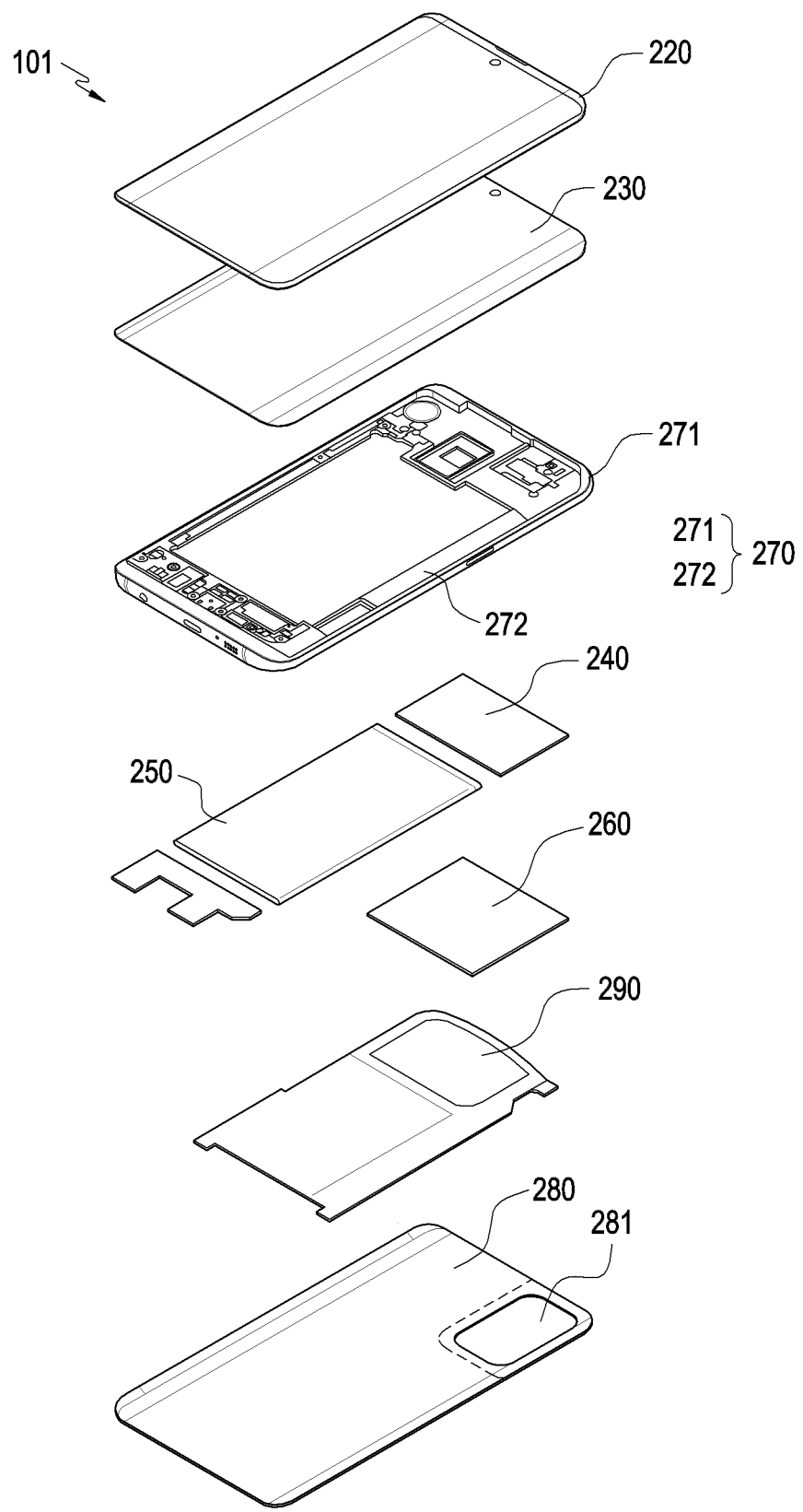
FIG. 4 is an exploded perspective view of an electronic device according to various embodiments of the disclosure.

FIG. 4 is an exploded perspective view of an electronic device 101 according to various embodiments of the disclosure.

Referring to FIG. 4, the electronic device 101 (e.g., the electronic device 101 of FIGS. 1 to 3) according to various embodiments may include a support bracket 270, a front plate 220 (e.g., the front plate 202 of FIG. 2), a display 230 (e.g., the display 201 of FIG. 2), a printed circuit board 240 (e.g., a PCB, a flexible PCB (FPCB), or a rigid flexible PCB (RFPCB)), a battery 250 (e.g., the battery 189 of FIG. 1), a second support member 260 (e.g., a rear case), an antenna 290 (e.g., the antenna module 197 of FIG. 1), and a rear plate 280 (e.g., the rear plate 211 of FIG. 2). The support bracket 270 of the electronic device 101 according to an embodiment may include a side bezel structure 271 (e.g., the side bezel structure 218 of FIG. 2) and a first support member 272.

In some embodiments, at least one (e.g., the first support member 272 or the second support member 260) of the components may be omitted from the electronic device 101, or the electronic device 101 may additionally include other components. At least one of the components of the electronic device 101 may be the same as or similar to at least one of the components of the electronic device 101 of FIG. 2 or 3, and a redundant description thereof is omitted below.

According to various embodiments, the first support member 272 may be disposed inside the electronic device 101 to be connected to the side bezel structure 271 or to be configured integrally with the side bezel structure 271. The first support member 272 may be made of, for example, a metal material and/or a non-metal (e.g., a polymer) material. The first support member 272 may have one surface to which the display 230 is coupled, and the other surface to which the printed circuit board 240 is coupled.

According to various embodiments, a processor, a memory, and/or an interface may be mounted on the printed circuit board 240. The processor may include, for example, one or more of a central processing unit, an application processor, a graphic processing unit, an image signal processor, a sensor hub processor, and/or a communication processor. According to various embodiments, the printed circuit board 240 may include a flexible printed circuit board type radio frequency cable (FRC). For example, the printed circuit board 240 may be disposed on at least a part of the first support member 272, and may be electrically connected to an antenna module (e.g., the antenna module 197 of FIG. 1) and a communication module (e.g., the communication module 190 of FIG. 1).

According to an embodiment, the memory may include, for example, a volatile memory and/or a nonvolatile memory.

According to an embodiment, the interface may include, for example, a high definition multimedia interface (HDMI), a universal serial bus (USB) interface, an SD card interface, and/or an audio interface. For example, the interface may electrically or physically connect the electronic device 101 to an external electronic device, and include a USB connector, an SD card/MMC connector, or an audio connector.

According to various embodiments, the battery 250 is a device for supplying power to at least one component of the electronic device 101 and may include, for example, a non-rechargeable primary cell, a rechargeable secondary cell, or a fuel cell. For example, at least a part of the battery 250 may be disposed on substantially the same plane as the printed circuit board 240. The battery 250 may be integrally disposed inside the electronic device 101 or may be disposed to be detachable from the electronic device 101.

According to various embodiments, the second support member 260 (e.g., a rear case) may be disposed between the printed circuit board 240 and the antenna 290. For example, the second support member 260 may include one surface to which at least one of the printed circuit board 240 or the battery 250 is coupled, and the other surface to which the antenna 290 is coupled.

According to various embodiments, the antenna 290 may be disposed between the rear plate 280 and the battery 250. The antenna 290 may include, for example, a near field communication (NFC) antenna, a wireless charging antenna, and/or a magnetic secure transmission (MST) antenna. For example, the antenna 290 may perform short-range communication with an external device or wirelessly transmit/receive power required for charging. In another embodiment, the antenna structure may be configured by a part of the side bezel structure 271 and/or the first support member 272 or a combination thereof.

According to various embodiments, the rear plate 280 may configure at least a part of the rear surface (e.g., the rear surface 210B of FIG. 3) of the electronic device 101. According to various embodiments, the rear plate 280 may include an opening 281 for camera placement. The opening may be disposed at a position where a camera module (e.g., the camera module 212 of FIG. 3) is disposed.

Figure 5:
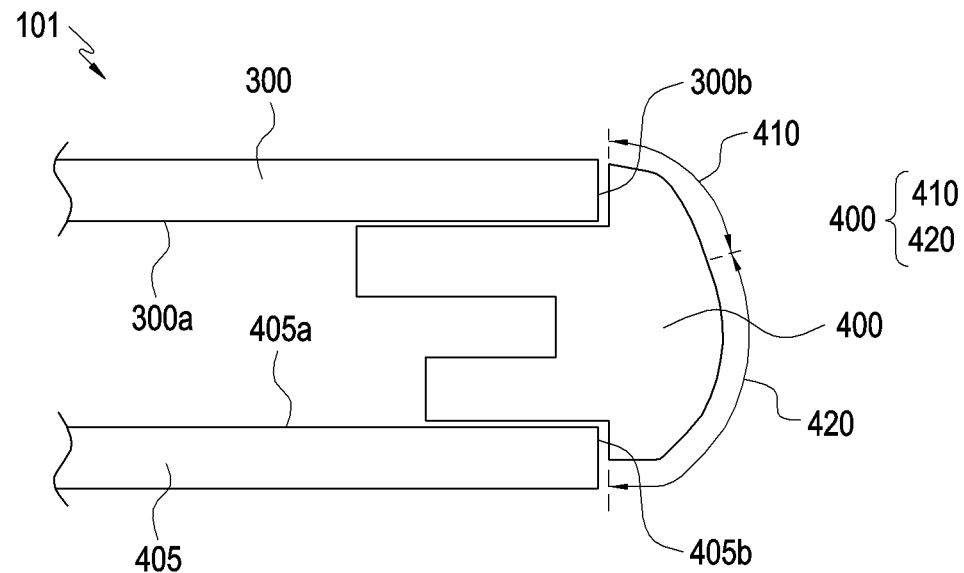
FIG. 5 is a schematic cross-sectional view illustrating a cover glass and a bracket of the electronic device of FIG. 2, taken along line A-A', according to various embodiments of the disclosure.
Figure 6:
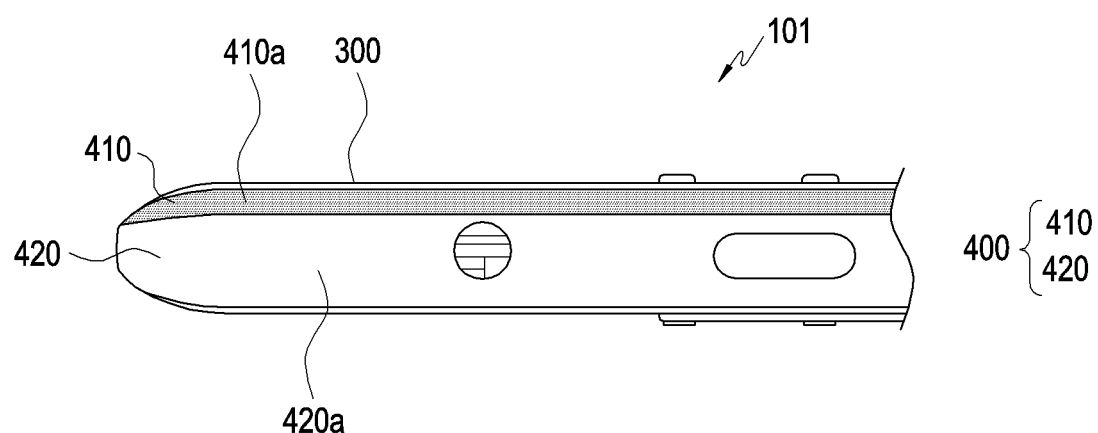
FIG. 6 is a side view of an electronic device viewed from a lower side, according to various embodiments of the disclosure.

FIG. 5 is a schematic cross-sectional view illustrating a cover glass 300 and a bracket 400 of the electronic device 101 of FIG. 2, taken along line A-A', according to an embodiment of the disclosure. FIG. 6 is a side view of the electronic device 101 of FIG. 2 viewed from a lower side, according to an embodiment of the disclosure.

Referring to FIGS. 5 and 6, the electronic device 101 may include a cover glass 300 configured to protect a display (e.g., the display 201 of FIG. 2), and a bracket 400 configured to support the electronic device 101. The cover glass 300 and the bracket 400 of FIGS. 5 and 6 may be partially or entirely the same as the configurations of the front plate 220 and the side bezel structure 271 of FIG. 4.

According to various embodiments, the cover glass 300 may be a 2-dimensional (2D) cover glass having a planar shape. According to various embodiments, the bracket 400 may receive at least a part of the cover glass 300. For example, the bracket 400 may be in contact with at least parts of a rear surface 300a and a side surface 300b of the cover glass 300. The bracket 400 may receive at least a part of a rear plate 405 (e.g., the rear plate 280 of FIG. 4). For example, the bracket 400 may be in contact with at least parts of an upper surface 405a and a side surface 405b of the rear plate 405. The bracket 400 may fix and/or support the cover glass 300, the rear plate 405, and components in the electronic device 101. The bracket 400 may be formed of various materials, including but not limited to, a metal material and/or a non-metal material. For example, the bracket may be made of an aluminum material.

According to various embodiments, the bracket 400 may include a first area 410 and a second area 420. The bracket 400 may be divided into the first area 410 and the second area 420 with reference to a side surface (e.g., the side surface 210C of FIG. 2) visually exposed to the outside of the electronic device 101. The first area 410 may be in contact with the cover glass 300 and may be a portion extending in a direction of a rear plate 405 (e.g., the rear plate 280 of FIG. 4) by a predetermined distance or more. The second area 420 may be a portion extending from the first area 410. Surface layers of the first area 410 and the second area 420 may have a curved shape surrounding the cover glass 300 and the rear plate 405 along the side surfaces 300b, 405b thereof. However, the division of areas of the bracket 400 shown in FIG. 5 is exemplary, and the sizes and/or widths of the first area 410 and the second area 420 are not limited to the above embodiment, and may be variously changed and designed.

According to various embodiments, the first area 410 may include a first surface layer 410a having a first texture and a first color. The first texture may be substantially the same texture as the cover glass 300. For example, the first texture may be a glossy texture having substantially the same gloss as the cover glass 300. The first color may be substantially the same color as the cover glass 300. For example, the first color may be black. Accordingly, the first area 410 may implement substantially the same texture and color as those of the cover glass 300, thereby providing an impression of unity with the cover glass 300. In relation to the first area 410 having a curved shape, a user may recognize the first area 410 as substantially the same as the cover glass 300 via the impression of unity with the cover glass 300. Via an impression of unity effect of the first area 410 having a curved shape and the cover glass 300, the 2D-shaped cover glass 300 may implement the same effect as having a 3D shape. However, the glossy and black characteristics substantially the same as those of the cover glass 300 are exemplary, and colors and/or patterns may be different according to printing specifications of the cover glass 300.

According to various embodiments, the second area 420 may include a second surface layer 420a having a second texture and a first color. The second texture may be a texture different from the first texture of the first surface layer 410a. The second texture may be a texture different from that of the cover glass 300. For example, the second texture may be matte or semi-gloss. By selecting a texture different from that of the cover glass 300 with respect to the second area 420, an effect that the cover glass 300 has a 3D shape can be maximized. In addition, referring to FIG. 6, the first area 410 and the second area 420 are divided, so that the overall area of the housing (e.g., the side surface 210C housing of FIG. 2) may appear narrow visually (or the thickness of the electronic device may appear thin). Accordingly, a slimming effect of the electronic device 101 may be realized. The color of the second area 420 may be the same as the first color of the first area 410. This may be for performing an anodizing method to be described later only once.

According to various embodiments, color difference values (L, a, and b) may be used at the time of measuring the color of an object. The color of the cover glass 300, the color of the first area 410, and the color of the second area 420 may all be substantially the same as the first color. However, even in the case where the cover glass, the first area, and the second area are colored identically with the same dye, there may be a difference in the color difference values (L, a, and b) according to a processing state of a surface. When color difference values of the cover glass 300 are L1, a1, and b1 and color difference values of the first area 410 are L2, a2, and b2, a difference between the two color difference values, and/or a deviation value $\beta E1$ may be 0 or more and 3 or less ($0 \leq \beta E1 \leq 3$). When color difference values of the first area 410 are L2, a2, and b2 and color difference values of the second area 420 are L3, a3, and b3, a difference between the two color difference values, and/or a deviation value $\beta E2$ may be greater than or equal to 3 ($\beta E2 \geq 3$). According to various embodiments, in the case of an L (brightness) value, the value may be $L1 \leq L2 \leq L3$. That is, even with the same color, since a high-gloss surface is perceived as a darker color than a blasted surface, the L (brightness) value may be lower in the high-gloss surface.

According to various embodiments, in comparison of the gloss of the cover glass 300, the gloss (or the first texture) of the first area 410, and the gloss (or the second texture) of the second area 420, the gloss of the cover glass 300 is the strongest. The gloss of the first area 410 (e.g., the first texture) may be substantially the same as or similar to the gloss of the cover glass 300, and, the gloss of the second area 420 (e.g., the second texture) may have the lowest gloss. Specifically, through a 60-degree gloss unit (GU) which can quantify the gloss reflectance of a surface, the gloss of the cover glass 300, the gloss (or the first texture) of the first area 410, and the gloss (or the second texture) of the second area 420 may be compared. The gloss of the cover glass 300 may be, for example, approximately 84 to 95 GU. The gloss (or the first texture) of the first area 410 may be, for example, approximately 50 to 65 GU. The gloss (or the second texture) of the second area 420 may be, for example, approximately 1 to 10 GU. In order to form an impression of unity of the first area 410 having a curved shape and the cover glass 300, gloss units of the gloss of the cover glass 300 and the gloss (or the first texture) of the first area 410 may be, for example, within a deviation value of approximately 50%.

The "texture" of a surface or area refers to a visual and/or tactile feeling felt on the surface of an object, and the texture may include gloss.

Figure 7:
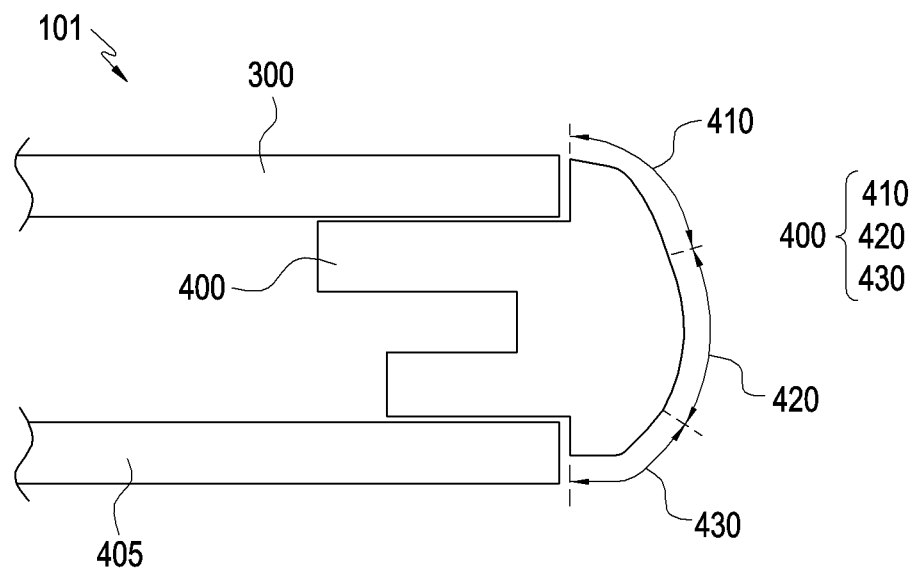
FIG. 7 is a schematic cross-sectional view illustrating a cover glass and a bracket of the electronic device of FIG. 2, taken along line A-A', according to another embodiment of the disclosure.
Figure 8:
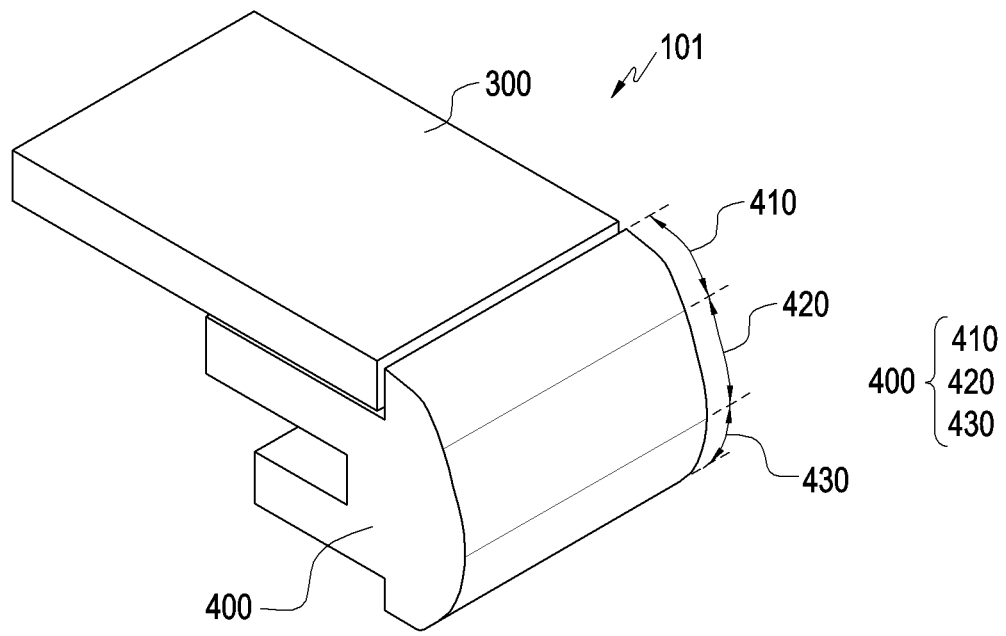
FIG. 8 is a schematic perspective view illustrating a portion of a cover glass and bracket of an electronic device, according to another embodiment of the disclosure.
Figure 9:
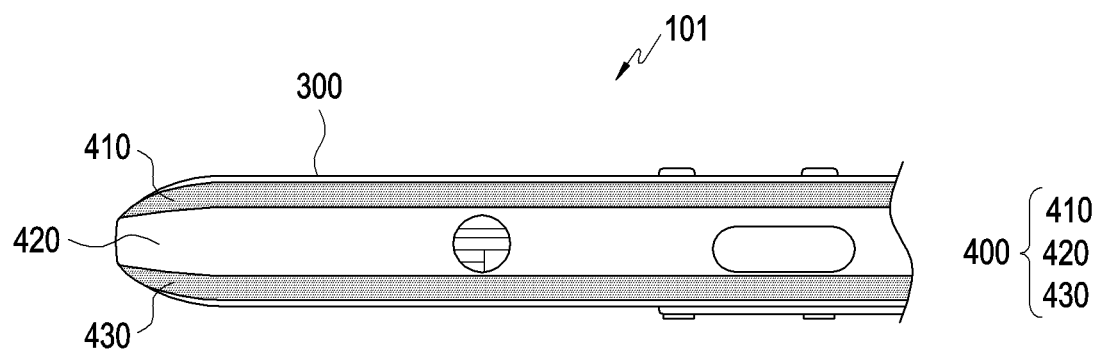
FIG. 9 is a side view of an electronic device viewed from a lower side, according to another embodiment of the disclosure.

FIG. 7 is a schematic cross-sectional view illustrating a cover glass 300 and a bracket 400 of the electronic device 101 of FIG. 2, taken along line A-A', according to another embodiment of the disclosure. FIG. 8 is a schematic partial view illustrating the cover glass 300 and the bracket 400 of the electronic device 101 of FIG. 2, taken along line A-A', according to another embodiment of the disclosure. FIG. 9 is a side view of the electronic device 101 of FIG. 2 viewed from a lower side, according to another embodiment of the disclosure.

Referring to FIGS. 7, 8, and 9, the electronic device 101 may include a cover glass 300 configured to protect a display (e.g., the display 201 of FIG. 2), and a bracket 400 configured to support the electronic device 101. The cover glass 300 and the bracket 400 of FIGS. 7, 8, and 9 may be partially or entirely the same as the configurations of the cover glass 300 and the bracket 400 of FIGS. 5 and 6.

According to an embodiment, the bracket 400 may include a first area 410, a second area 420, and a third area 430. The bracket 400 may be divided into the first area 410, the second area 420, and the third area 430 with reference to a side surface visually exposed to the outside of the electronic device 101. The first area 410 may be in contact with the cover glass 300 and may be a portion extending in a direction of a rear plate 405 (e.g., the rear plate 280 of FIG. 4) by a predetermined distance or more. The second area 420 may be a portion extending from the first area 410. The third area 430 may extend from the second area 420 and be in contact with the rear plate 405. Surface layers of the first area 410, the second area 420, and the third area 430 may have a curved shape. However, the division of areas of the bracket 400 shown in FIG. 7 is exemplary, and the sizes and/or widths of the first area 410, the second area 420, and the third area 430 are not limited to the above embodiment, and may be variously changed and designed.

According to various embodiments, the third area 430 may include a third surface layer having a third texture and a third color. The third area 430 may be substantially the same as the first area 410. The third texture may be substantially the same texture as the first texture and of the cover glass 300. For example, the third texture may be glossy. The third color may be substantially the same color as the first color and/or the cover glass 300. For example, the third color may be black.

According to an embodiment, the third area 430 may include a third surface layer having the third texture and the third color. The third texture may be a pattern and/or texture which may be implemented through film, printing, and/or painting of the rear plate 405. The third color may be substantially the same color as the first color of the first area 410 and/or the cover glass 300. For example, the third color may be black.

Referring to FIG. 9, the first area 410, the second area 420, and the third area 430 are divided, so that the overall area of the housing (e.g., the side surface 210C housing of FIG. 2) may appear narrow visually. Accordingly, a slimming effect of the electronic device 101 can be maximized. The texture refers to a visual and/or tactile feeling felt on the surface of an object, and the texture may include gloss.

Figure 10:
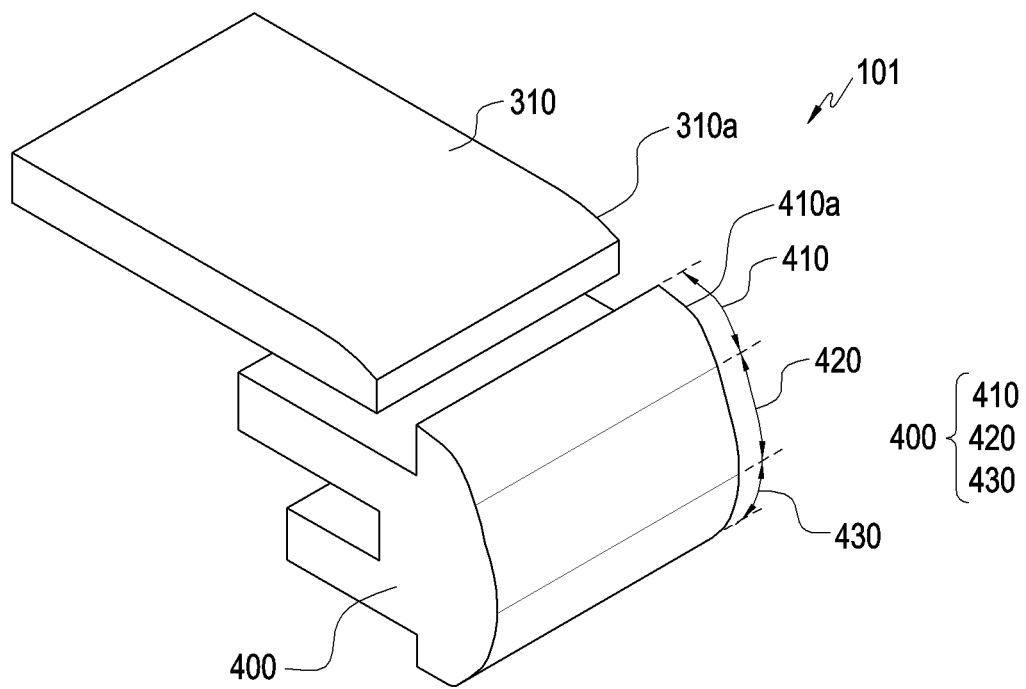
FIG. 10 is a schematic perspective view illustrating a portion of a cover glass and bracket of an electronic device, according to another embodiment of the disclosure.
Figure 11:
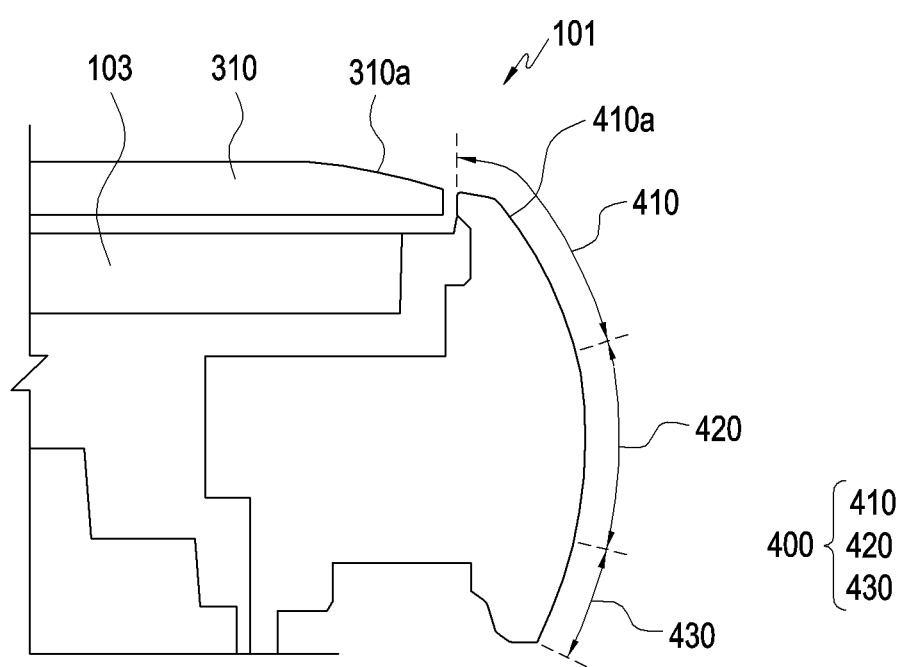
FIG. 11 is a schematic cross-sectional view illustrating at least parts of a 2.5D cover glass and a bracket, according to an embodiment of the disclosure.

FIG. 10 is a schematic partial view illustrating a cover glass 310 and a bracket 400 of an electronic device 101 of FIG. 2, taken along line A-A', according to another embodiment of the disclosure. FIG. 11 is a schematic cross-sectional view illustrating at least parts of the cover glass 310 and the bracket 400, according to another embodiment of the disclosure.

Referring to FIGS. 10 and 11, the electronic device 101 may include a 2.5D cover glass 310 configured to protect a display 103 (e.g., the display 201 of FIG. 2), and the bracket 400 configured to support the electronic device 101. The bracket 400 of FIG. 10 may be partially or entirely the same as the configuration of the bracket 400 of FIGS. 7 and 8. As shown, the bracket 400 includes or defines a first area 410, a second area 420, and a third area 430, similar to that shown and described with respect to FIGS. 7-9.

According to an embodiment, the cover glass 310 of the electronic device 101 may be the 2.5D cover glass. The 2.5D cover glass 310 may be in the form of glass having a curvature at an end or edge portion 310a thereof. The curvature of the end portion 310a of the 2.5D cover glass 310 may be substantially same as a curvature of the bracket 400 in an area in contact with the 2.5D cover glass 310. For example, the curvature of the end portion 310a (e.g., a first curvature end portion) of the 2.5D cover glass 310 and a curvature of an end portion 410a (e.g., a second curvature end portion) of the first area 410 of the bracket 400 may be substantially the same or similar. For example, the curvature of the end portion 310a of the 2.5D cover glass 310 and the curvature of the end portion 410a of the first area 410 of the bracket 400 may have a deviation of about 30% or less. For example, the curvature of the end portion 310a of the 2.5D cover glass 310 and the curvature of end portion 410a of the first area 410 of the bracket 400 may have a deviation of about 1% or more and 30% or less. Accordingly, an impression of unity that is naturally connected from the 2.5D cover glass 310 to the first area 410 of the bracket 400 may be realized.

Figure 12:
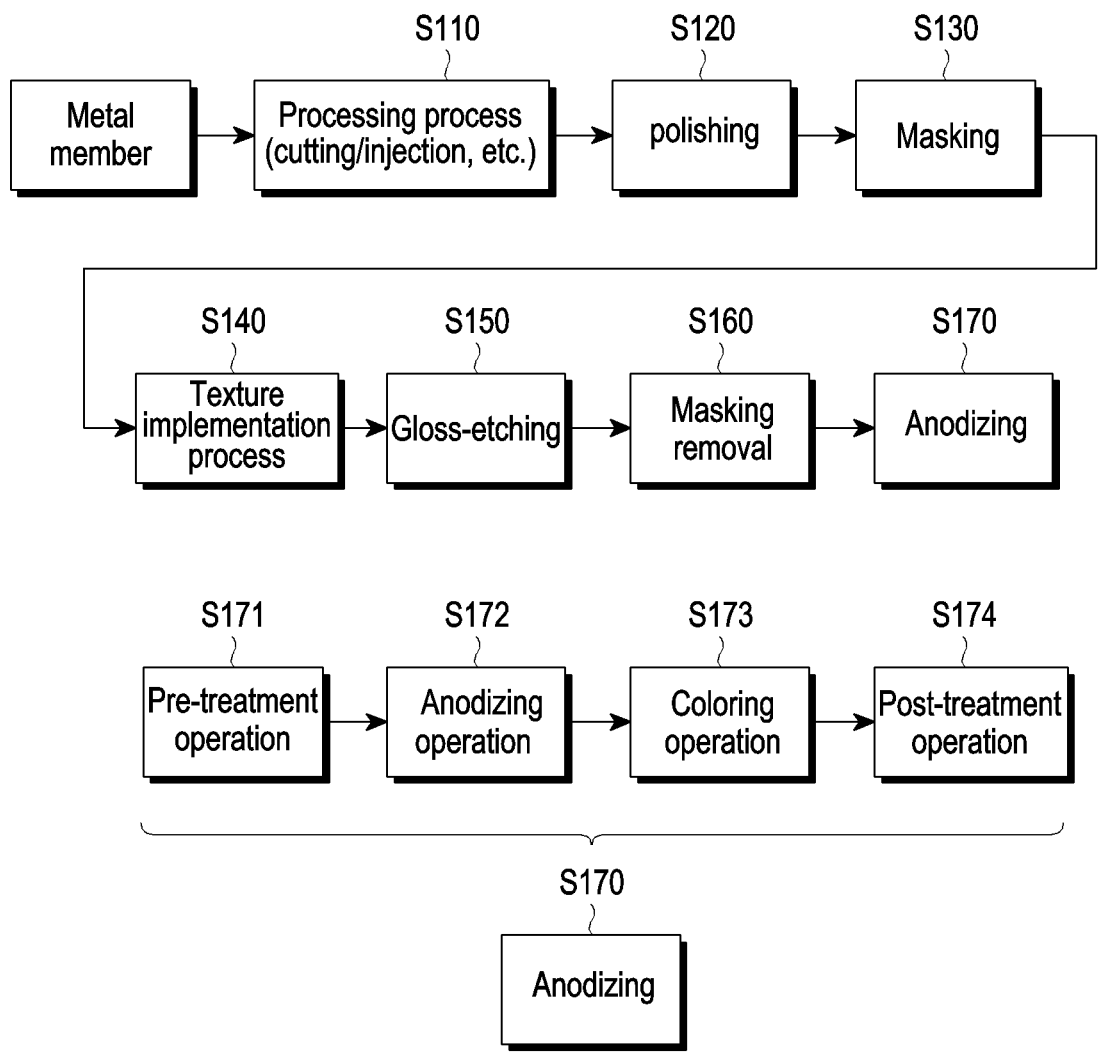
FIG. 12 illustrates a method for manufacturing a bracket of an electronic device, according to various embodiments of the disclosure.
Figure 13:
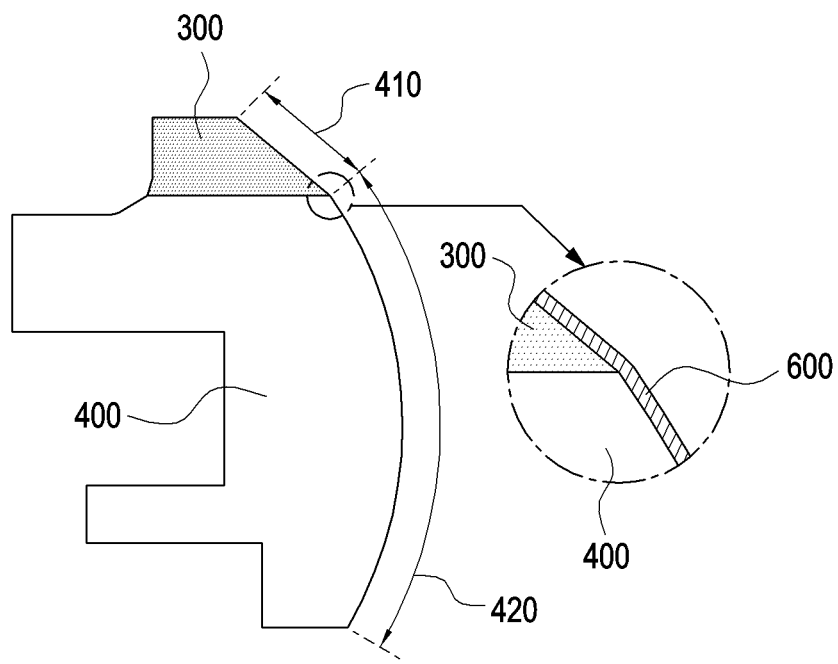
FIG. 13 is a schematic cross-sectional view illustrating a surface layer of an electronic device after a process of forming an oxide film layer on a bracket, according to an embodiment of the disclosure.
Figure 14:
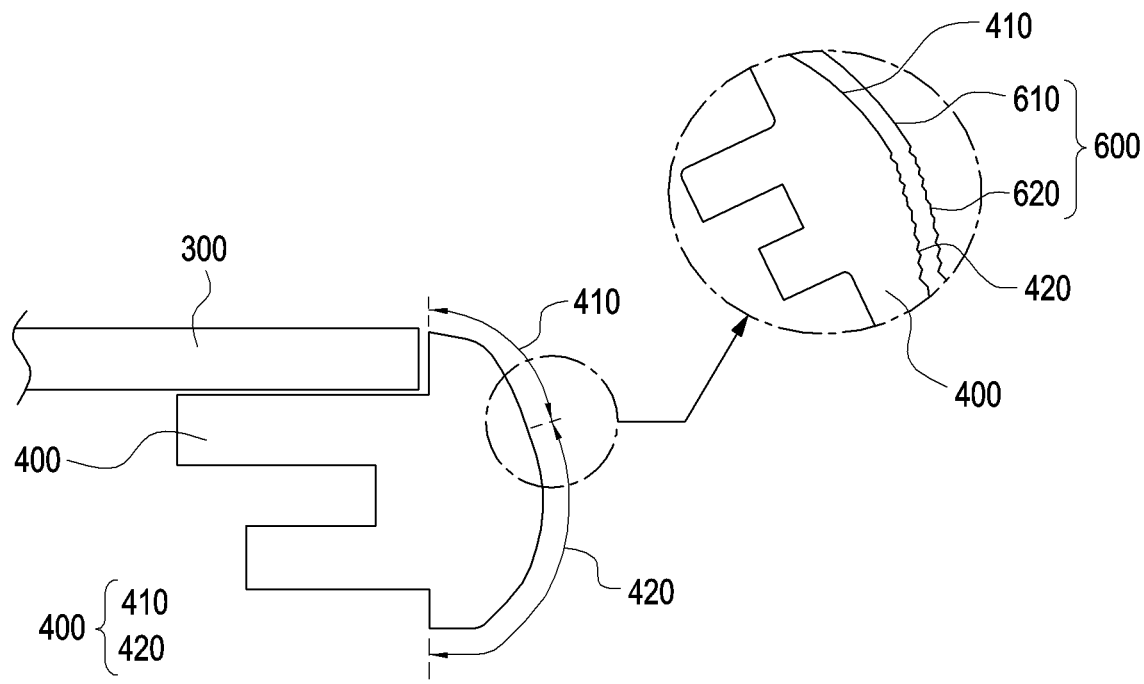
FIG. 14 is a view illustrating a shape of an oxide film according to a surface layer of each area configuring a bracket, according to various embodiments of the disclosure.
Figure 15:
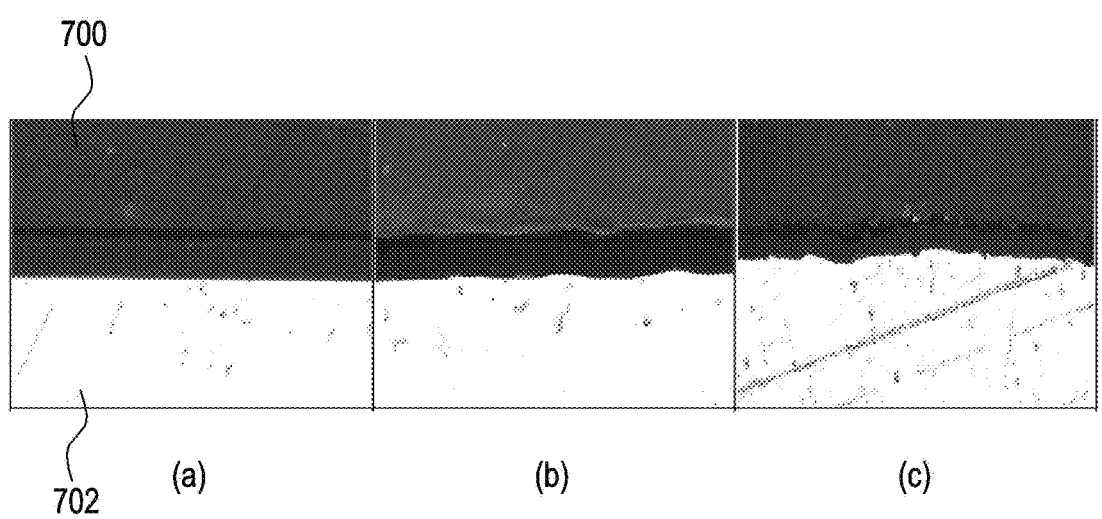
FIG. 15 is a view illustrating a comparison of a shape of an oxide film according to an oxide film formation surface.

FIG. 12 illustrate a method for manufacturing a bracket 400 of an electronic device 101, according to various embodiments of the disclosure. FIG. 13 is a schematic cross-sectional view illustrating a surface layer of an electronic device after a seventh process (S170) of forming an oxide film layer 600 on a bracket 400, according to an embodiment of the disclosure. FIG. 14 is a view illustrating a shape of an oxide film according to a surface layer of each area configuring a bracket 400, according to various embodiments of the disclosure. FIG. 15 is a view illustrating a comparison of a shape of an oxide film according to an oxide film formation surface.

Referring to FIG. 12, a method for manufacturing a bracket 400 may include a first process (S110) of processing a metal member, a second process (S120) of polishing a surface of the processed metal member, a third process (S130) of disposing a masking layer on a first area 410 of the bracket 400, a fourth process (S140) of implementing a texture on a second area 420 on which the masking layer is not applied, a fifth process (S150) of adjusting glossiness of the second area 420, a sixth process (S160) of removing the masking layer of the first area 410, and a seventh process (S170) of forming an oxide film layer 600 on the bracket 400. A cover glass 300, the bracket 400, the first area 410, the second area 420, a first texture, and a second texture of FIGS. 12, 13, and 14 may be all or partially the same as the cover glass 300, the bracket 400, the first area 410, the second area 420, the first texture, and the second texture of FIGS. 5 and 6.

According to various embodiments, the metal member may be aluminum (Al). Aluminum metal may be well used for an exterior material of electronic equipment.

According to various embodiments, a process of processing a metal member may be performed (S110). The processing process may include a process such as a cutting process including a computer numerical control (CNC) and/or an injection joining process. The metal member may configure the external appearance of the electronic device 101 through the processing process. It will be appreciated that the processing process may include various other types of manufacturing and/or processing of the metal member. For example, additive manufacturing, molding, machining, milling, and the like may be used to form and process the metal member.

According to various embodiments, a process of polishing a surface of the processed metal member may be performed (S120). The process may be a process of increasing the gloss of the metal member configuring the bracket 400. Accordingly, the cover glass 300 has substantially the same gloss as that of glass, and the bracket 400 may form an impression of unity with the cover glass 300. As a result of microprocessing of the bracket 400, a polishing process may be performed to remove the grain of the material, and an additional polishing operation may be performed to form a more polished surface. That is, the polishing process may be a multi-step operation that incrementally increases the polished texture of the surface of the processed metal member. In some embodiments, the polishing may be a high gloss polishing process.

According to various embodiments, a process of disposing the masking layer on the first area 410 of the bracket 400 may be performed (S130). The masking layer may include a high-viscosity resin material. For example, the resin of the masking layer may have a viscosity of about 15000 centipoise (cP) or more. For example, the resin of the masking layer may have a viscosity of about 15000 cP or more and 100000 cP or less. When the resin of the masking layer is applied to the surface of the first area 410 of the bracket 400 and then irradiated with light such as heat or UV, the masking layer may be cured from a shape having viscosity to a shape having hardness. Due to the high viscosity, the masking layer including the resin may maintain a shape applied to the first area 410 of the bracket 400 as it is even when the masking layer is not cured, so that the masking layer may be uniformly applied even in a 3D shape including a curved surface. The masking layer may protect the first area 410 of the bracket 400. For example, a portion to which the masking layer is applied may be protected from external impact and damage due to the chemical resistance and impact resistance characteristics of the cured resin.

According to various embodiments, a texture different from that of the first area 410 may be implemented in the second area 420 of the bracket 400 (S140). The second texture that is different from the first texture of the first area 410 may be implemented in the second area 420 of the bracket 400. For example, the second texture may be matte or semi-gloss, as compared to the gloss texture of the first area 410. The texture implementation process (S140) may include multiple processes or steps, which may be involved in the gloss and texture of an exterior material, such as, but not limited to, a sand blasting, hairline, and/or barrel process. Through the texture implementation process (S140), only the second area 420 on which the masking layer is not disposed may be selectively textured.

According to various embodiments, a gloss-etching process of adjusting glossiness of the second area 420 may be performed (S150). The gloss-etching process (S150) may be a process for adjusting the detailed glossiness of the second area 420 of the bracket 400 in which a texture is implemented. In the gloss-etching process (S150), a process such as chemical polishing may be used. However, the process may be performed or omitted if necessary.

According to various embodiments, a process of removing the masking layer of the first area 410 may be performed (S160). A method for removing the masking layer may include a method for transferring heat above a predetermined temperature or immersing in a dedicated solvent solution to softly release a cured masking layer, and then removing the masking layer by a physical force. The first area 410 from which the masking layer is removed may be a glossy surface. In the bracket 400, the first area 410 which is glossy and the second area 420 having a matte or semi-glossy texture may coexist without a step difference.

According to various embodiments, a process of forming an oxide film layer on the bracket 400 may be performed (S170). Anodizing may be performed on the polished first area 410 and the second area 420 in which a texture different from that of the first area 410 is implemented. The anodizing may refer to anodic oxidation treatment, and may be a process manner of electrochemically making an oxide film by using a metal to be plated as an anode. For example, the anodizing may be well used for surface post-treatment of aluminum. The anodizing process may be largely divided into a pre-treatment operation (S171), an anodizing operation (S172), a coloring operation (S173), and a post-treatment operation (S174).

According to various embodiments, the pre-treatment operation (S171) may include processes such as a degreasing process and a desmut process. The degreasing process may be performed to remove pollutants such as stains on a product. In the degreasing process, a degreasing solution may be selectively applied as acidity or neutral depending on a situation. The desmut process may be performed to remove smuts and foreign substances on the surface of a material, generated from the degreasing process.

According to various embodiments, after the pre-treatment operation (S171), the surface of the metal member may be anodized (S172). In the anodizing operation, a reaction may occur with oxygen while a voltage is applied to the metal member, so that an oxide film having high density may be formed. A working voltage is, for example, applicable within a range of about 5 to 20V, and a process time may take about 10 minutes or more and 3 hours or less. A process temperature may be, for example, in a range of approximately 5-30° C.

According to various embodiments, referring to FIGS. 14 and 15, an anodized film 700 may grow vertically according to a shape of a raw material 702. For example, in the case of a high-gloss surface (e.g., case (a) of FIG. 15), a film may also grow flat. For example, in the case of a sanding-treated surface (e.g., case (b) of FIG. 15), a film grows perpendicular to the curved shape, so that an oxide film may also be formed to be curved. For example, in the case of a more roughly sanded surface (e.g., case (c) of FIG. 15), a film grows vertically according to a rough surface, so that an oxide film may also be formed to be rough. According to various embodiments, referring to FIG. 14, in the case of the first area 410, a flat oxide film 610 may be formed such as the high-gloss surface (e.g., case (a) of FIG. 15). In the case of the second area 420, an oxide film 620 may be formed to be curved, such as the sanding-treated surface (e.g., case (b) of FIG. 15) and/or the rough sanded surface (e.g., case (c) of FIG. 15).

According to various embodiments, after the anodizing process (S172), a coloring process (S173) may be performed. The coloring process (S173) may be a process of expressing color on the oxide film. The coloring process (S173) may include a process such as an immersion method, an electrolytic coloring method, and/or an oil-based method. The immersion method may be a method of depositing a product in a solution in which a dye is dissolved, so as to realize a color from a diffused and adsorbed dye. The electrolytic coloring method may be a method of causing color development by applying an electric current in a metal salt electrolyte. The oil-based method may be a coloring method in which the oxide film is photosensitized and dried, and then an oil-based dye is applied with a brush. The type of dyes of the immersion method may include both an organic dye and an inorganic dye, and the immersion method may be referred to as an aqueous method in that dyes of the immersion method are mainly dissolved in water.

According to various embodiments, the post-treatment operation (S174) may be performed after the coloring process (S173). In the post-treatment operation (S174), a film sealing treatment and a sealing post-treatment may be performed. The sealing treatment may include a method of treatment including a metal salt, a method of treating a non-metal salt made of an organic material, and a hydration-sealing treatment method using water and water vapor. The sealing post-treatment may include an elution process for removing a metal salt, and a hot water washing process for cleaning foreign substances. The post-treatment operation (S174) may be performed for stability and reliability of the external appearance of a material subjected to anodizing and coloring treatment.

According to various embodiments, referring to FIG. 13, according to various embodiments of the disclosure, the above-described anodizing process (e.g., the seventh process (S170)) may be performed only once in a final operation. Accordingly, according to a plurality of times of anodizing, the anodized film does not break or a crack between the anodizing does not appear, and the oxide film layer 600 may appear continuously.

According to an embodiment, the above-described anodizing process (e.g., the seventh process (S170)) may be performed two or more times. When the anodizing is performed two or more times, after the third process (S130) of disposing the masking layer on the first area 410, a first anodizing process (not illustrated) of generating an oxide film with respect to the second area 420 may be performed. Thereafter, after the sixth process (S160) of removing the masking layer 500 of the first area 410 and a process (not illustrated) of processing a conduction hole in which an anodizing jig (not illustrated) may be mounted, a second anodizing process (not illustrated) of generating an oxide film with respect to the first area 410 may be performed. When anodizing is performed two or more times, the first area 410 may include a first surface layer having a first texture and a first color substantially the same as the cover glass 300. The second area 420 may include a second surface layer having a second texture and a second color which are different from the first area 410. Accordingly, the thickness of the electronic device 101 may visually appear thin by dividing the first area 410 and the second area 420 according to a color and/or a texture while implementing an effect such that the cover glass 300 has a 3D shape. An electronic device (e.g., the electronic device 101 of FIG. 1) according to various embodiments of the disclosure may include: a cover glass (e.g., the cover glass 300 of FIG. 5) configured to protect a display; and a bracket (e.g., the bracket 400 of FIG. 5) configured to support the electronic device, wherein the bracket includes a first area (e.g., the first area 410 of FIG. 5) in contact with the cover glass and a second area (e.g., the second area 420 of FIG. 5) extending from the first area, the first area includes a first surface layer to which a first texture and a first color are applied, the second area includes a second surface layer to which a second texture different from the first texture is applied, the first color is substantially the same color as the cover glass, and the first texture is substantially the same texture as the cover glass.

According to various embodiments, the second texture may be matte or semi-glossy, and may be different from a texture of the cover glass.

According to various embodiments, the bracket may further include a third area (e.g., the third area 430 of FIG. 7) extending from the second area, and the third area may include a third surface layer to which a third texture and a third color are applied. The third texture and the third color may be the same as the first texture and the first color.

According to various embodiments, the first surface layer of the first area may have a curved shape.

According to various embodiments, the first area has the first color and the first texture, and the first area has an impression of unity with the cover glass, so that a shape of the cover glass may appear as a 3D shape.

According to various embodiments, the second texture of the second surface layer is different from the first texture of the first surface layer which is substantially the same texture as the cover glass, so that a thickness of the electronic device may appear thin.

According to various embodiments, the cover glass may be a 2.5D cover glass (e.g., the 2.5D cover glass 310 of FIGS. 10-11) having a constant curvature at an end or edge portion thereof.

According to various embodiments, the curvature formed at the end or edge portion of the 2.5D cover glass may be substantially the same as a curvature of the first area in contact with the 2.5D cover glass.

According to various embodiments, the curvature formed at the end portion of the 2.5D cover glass and the curvature of the first area in contact with the 2.5D cover glass may have a curvature deviation of 1% or more and 30% or less.

A method for manufacturing a bracket of an electronic device (e.g., the electronic device 101 of FIG. 1) according to various embodiments of the disclosure may include: polishing a surface of a metal member of the bracket; disposing a masking layer on a first area of the bracket; implementing a texture different from that of the first area in a second area of the bracket; removing the masking layer; and performing anodizing on the polished first area and the second area in which the texture different from that of the first area is implemented.

According to various embodiments, the metal member of the bracket may include aluminum.

According to various embodiments, wherein the method may further include processing the metal member of the bracket through at least one of a cutting process and an injection joining process.

According to various embodiments, the masking layer may include a resin having viscosity.

According to various embodiments, the resin of the masking layer may have a viscosity of 15000 cp or more and 100000 cp or less.

According to various embodiments, the implementing of the texture may include implementing a second texture different from the first texture of the first area in the second area of the bracket.

According to various embodiments, the second texture may be matte or semi-glossy. In some embodiments, the second texture is different from a texture of the cover glass.

According to various embodiments, the implementing of the texture may include at least one of sand blasting, hairline, and barrel processes.

According to various embodiments, the method may further include gloss-etching to adjust a glossiness of the second area, after the implementing of the second texture.

According to various embodiments, the anodizing may be performed only once.

According to various embodiments, the anodizing may be performed at a temperature of 5° C. or higher and 30° C. or lower.

An electronic device 101 including a bracket 400 and a manufacturing method according to various embodiments of the disclosure described above are not limited by the above-described embodiments and drawings, and it will be apparent to a person skilled in the art to which the disclosure pertains that various substitutions, modifications and changes are possible within the technical scope of the disclosure.

What is claimed is:

1. A method for manufacturing a bracket of an electronic device, the method comprising:
    polishing a surface of a metal member that forms at least a portion of the bracket, wherein the surface comprise a first area and a second area of the metal member;
    disposing a masking layer on the first area of the metal member;
    forming a second texture on the second area of the metal member, wherein the second texture is different from that of the first area;
    removing the masking layer from the first area; and
    forming an oxide film layer on the first area and the second area.

2. The method of claim 1, wherein the metal member of the bracket comprises aluminum.

3. The method of claim 1, wherein the method further comprises processing the metal member of the bracket through at least one of a cutting process or an injection joining process.

4. The method of claim 1, wherein the masking layer comprises a resin having viscosity.

5. The method of claim 4, wherein the resin of the masking layer has a viscosity of 15000 cP or more and 100000 cP or less.

6. The method of claim 1, wherein the polishing comprises removing a grain of the material of the metal member.

7. The method of claim 1, wherein the second texture is matte or semi-glossy and different from a cover glass of the electronic device.

8. The method of claim 1, wherein the formation of the second texture comprises at least one of sand blasting, hairline, or barrel processes.

9. The method of claim 1, further comprising gloss-etching of the second area to adjust a glossiness thereof after the formation of the second texture.

10. The method of claim 1, wherein the formation of oxide film layer is performed only once.

11. The method of claim 1, wherein the formation of the oxide film layer is performed at a temperature of 5° C. or higher and 30° C. or lower.

\* \* \* \* \*